(12) United States Patent
Song et al.

(10) Patent No.: US 9,312,333 B2
(45) Date of Patent: Apr. 12, 2016

(54) RESONATOR HAVING TERMINALS AND A METHOD FOR MANUFACTURING THE RESONATOR

(75) Inventors: In Sang Song, Osan-si (KR); Sung Woo Hwang, Seoul (KR); Yun Kwon Park, Dongducheon-si (KR); Byeong Kwon Ju, Seoul (KR); Jae Sung Rieh, Seoul (KR); Jea Shik Shin, Hwaseong-si (KR); Hee Tae Kim, Seosan-si (KR)

(73) Assignees: Samsung Electronics Co., Ltd., Suwon-si (KR); Korea University Industrial & Academic Collaboration Foundation, Seoul (KR)

( * ) Notice: Subject to any disclaimer, the term of this patent is extended or adjusted under 35 U.S.C. 154(b) by 145 days.

(21) Appl. No.: 13/302,091

(22) Filed: Nov. 22, 2011

(65) Prior Publication Data

US 2012/0126327 A1 May 24, 2012

(30) Foreign Application Priority Data

Nov. 22, 2010 (KR) ........................ 10-2010-0116247

(51) Int. Cl.
| | |
|---|---|
| *H01L 29/06* | (2006.01) |
| *B82Y 10/00* | (2011.01) |
| *B82Y 40/00* | (2011.01) |
| *H01L 29/10* | (2006.01) |
| *H01L 29/41* | (2006.01) |
| *H01L 29/423* | (2006.01) |
| *H01L 29/66* | (2006.01) |
| *H03D 1/18* | (2006.01) |
| *H03D 3/26* | (2006.01) |

(Continued)

(52) U.S. Cl.
CPC ............. *H01L 29/0676* (2013.01); *B82Y 10/00* (2013.01); *B82Y 40/00* (2013.01); *H01L 29/1033* (2013.01); *H01L 29/413* (2013.01); *H01L 29/4238* (2013.01); *H01L 29/42376* (2013.01); *H01L 29/66439* (2013.01); *H03D 1/18* (2013.01); *H03D 3/26* (2013.01); *H03D 7/12* (2013.01); *H01L 29/785* (2013.01); *H03H 2009/02314* (2013.01)

(58) Field of Classification Search
CPC ...................... H01L 29/0669; H01L 21/02603
See application file for complete search history.

(56) References Cited

U.S. PATENT DOCUMENTS

| | | | |
|---|---|---|---|
| 6,803,840 B2 | 10/2004 | Hunt et al. | |
| 2005/0274992 A1* | 12/2005 | Appenzeller et al. | ......... 257/288 |

(Continued)

FOREIGN PATENT DOCUMENTS

| | | |
|---|---|---|
| JP | 2005-229017 | 8/2005 |
| JP | 2007-000991 | 1/2007 |

(Continued)

OTHER PUBLICATIONS

Bargatin, I., et al., "Efficient electrothermal actuation of miltiple modes of high-frequency nanoelectromechanical resonators", Applied Physics LEtters, 2007, pp. 093116-1 to 093116-3, vol. 90 (American Institute of Physics).

(Continued)

*Primary Examiner* — Benjamin Sandvik
(74) *Attorney, Agent, or Firm* — NSIP Law

(57) ABSTRACT

A resonator and a method for manufacturing a resonator are provided. The method may include doping a wafer, and forming on the wafer a substrate, a drain electrode, a source electrode, a gate electrode, and at least one nanowire.

21 Claims, 9 Drawing Sheets

(51) Int. Cl.
*H03D 7/12* (2006.01)
*H01L 29/78* (2006.01)
*H03H 9/02* (2006.01)

(56) References Cited

U.S. PATENT DOCUMENTS

| | | | |
|---|---|---|---|
| 2008/0224224 A1* | 9/2008 | Vandenderghe et al. | 257/365 |
| 2009/0184783 A1* | 7/2009 | Park et al. | 333/219.2 |
| 2009/0309676 A1* | 12/2009 | Zettl et al. | 333/186 |
| 2010/0140066 A1* | 6/2010 | Feng et al. | 200/181 |
| 2010/0244855 A1* | 9/2010 | Agache et al. | 324/634 |

FOREIGN PATENT DOCUMENTS

| | | |
|---|---|---|
| JP | 2007-184566 | 7/2007 |
| JP | 2008-258594 | 10/2008 |
| JP | 2009-076938 | 4/2009 |
| KR | 10-2004-0108760 | 12/2004 |
| KR | 10-2006-0111149 | 10/2006 |
| KR | 10-2008-0051030 | 6/2008 |
| KR | 10-2009-0081218 | 7/2009 |

OTHER PUBLICATIONS

He, Rongrui, et al., "Letters: Giant piezoresistance effect in silicon Nanowires", Nature Nanotechnology, Oct. 2006, pp. 42-46, vol. 1 (Nature Publishing Group).

He, Rongrui, et al., "Supplementary Information: Giant Piezoresistance Effect in Silicon Nanowires", Nature Nanotechnology, 2006, pp. 42-46, vol. 1 (Nature Publishing Group).

He, Rongrui, et al., "Self-Transducing Silicon Nanowire Electromechanical Systems at Room Temperature", Nano Letters, 2008, pp. 1756-1761, vol. 8, No. 6 (American Chemical Society).

\* cited by examiner

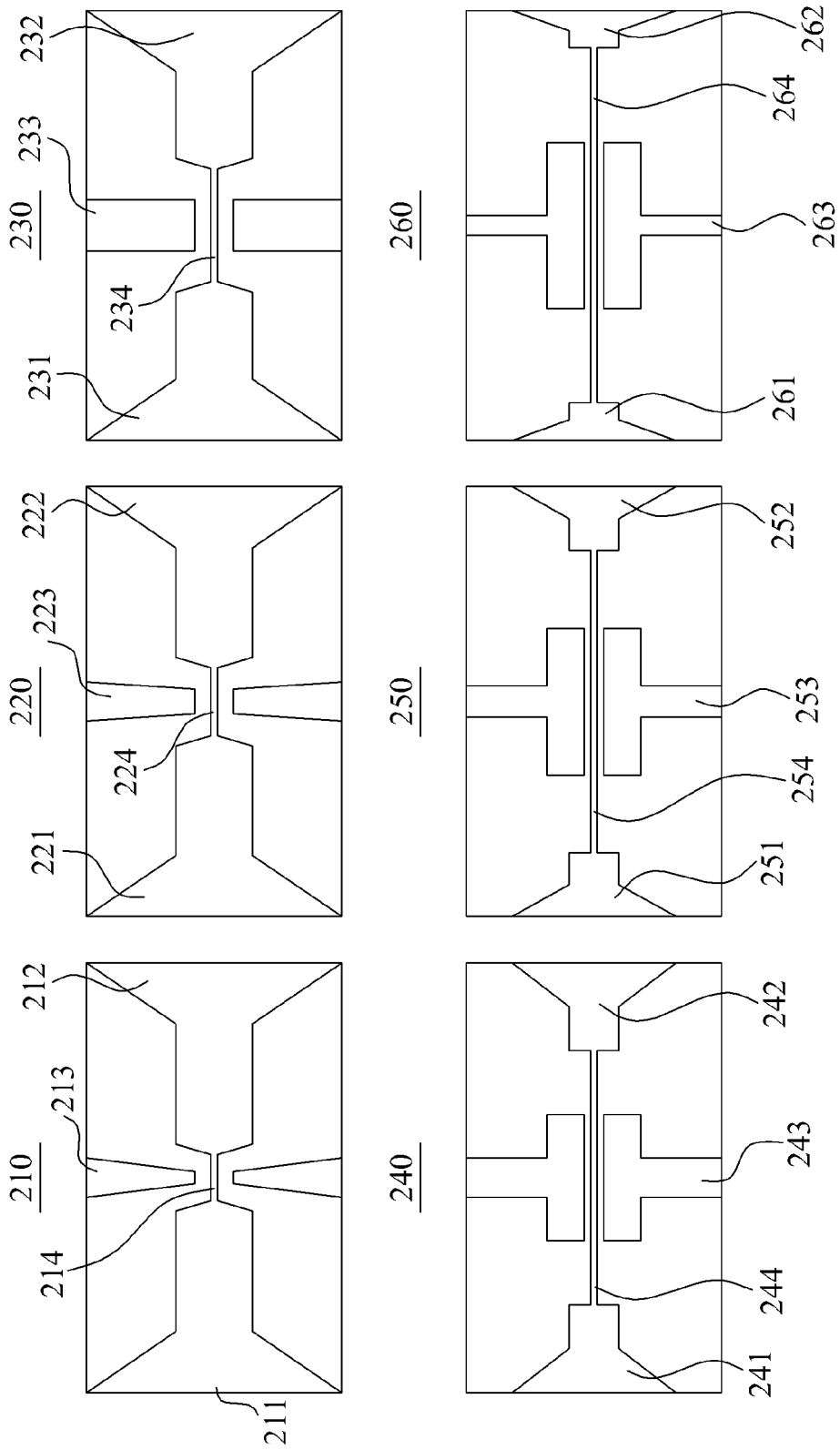

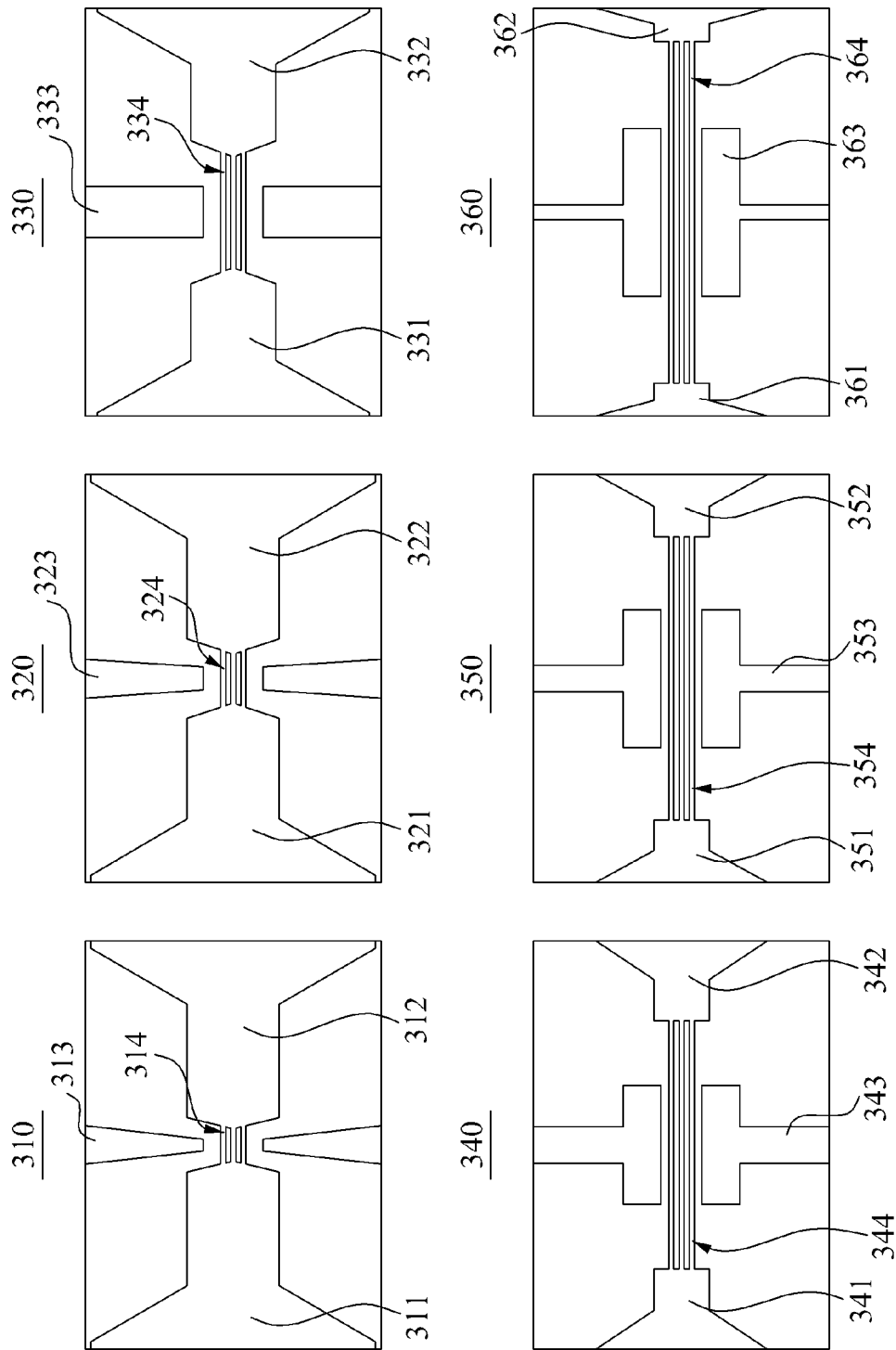

RESONATOR HAVING TERMINALS AND A METHOD FOR MANUFACTURING THE RESONATOR

CROSS-REFERENCE TO RELATED APPLICATION(S)

This application claims the benefit under 35 U.S.C. §119(a) of Korean Patent Application No. 10-2010-0116247, filed on Nov. 22, 2010, in the Korean Intellectual Property Office, the entire disclosure of which is incorporated herein by reference for all purposes.

BACKGROUND

1. Field

The following description relates to a resonator having terminals and a method for manufacturing the resonator.

2. Description of Related Art

A frequency characteristic of a resonator is significantly influenced by a size of the resonator, a design of a fixed beam, and process conditions.

To utilize an ultrahigh frequency (UHF) region, a process for manufacturing a resonator having an extremely small size is indispensable; mode shapes, force constants, and frequencies are changed depending on a scheme used to fix a beam. A frequency currently available by electron beam lithography is greater than gigahertz (GHz). The maximum limit for a technology of manufacturing a beam with a size much smaller than the frequency is expected to reach a molecular region.

In such a limited region, a nano device may have a resonance frequency in a terahertz (THz) range, namely, molecular vibration characteristics. Such a resonance frequency range is based the presumption that driving is performed in an ultra-low temperature and at an ultra-low pressure.

Accordingly, there is a desire for a new resonator and a method for manufacturing the resonator that may achieve a practicable UHF.

SUMMARY

According to one aspect a method for manufacturing a resonator is provided. The method includes doping a wafer, and forming on the wafer a substrate, a drain electrode, a source electrode, a gate electrode, and at least one nanowire.

A first end of the at least one nanowire may be operatively connected to the drain electrode, a second end of the at least one nanowire may be operatively connected to the source electrode, and the at least one nanowire may be spaced apart from a top surface of the substrate.

At least one nanowire may be spaced apart by a predetermined distance from a top surface of the substrate.

A first end of the at least one nanowire may be P-type doped, and the second end of the at least one nanowire may be N-type doped.

Doping of the wafer may include P-type doping a first region of the wafer and N-type doping a second region of the wafer.

P-type doping and the N-type doping includes P-type doping a first region by implanting a P-type impurity ion in the first region, and N-type doping the second region, by implanting an N-type impurity ion in the second region.

A drain electrode may be formed by etching one of the P-type doped first region and the N-type doped second region, and a source electrode may formed by etching the other one of the P-type doped first region and the N-type doped second region.

A gate electrode may be formed on a side of the at least one nanowire.

The method may further include forming a second gate electrode on the wafer.

A gate electrode and the second gate electrode may be formed on the wafer so as to be on opposing sides of the at least one nanowire.

A first gate electrode and second gate electrode are formed on the wafer so as to be spaced apart at a predetermined distance from the at least one nanowire.

A substrate, a drain electrode, a source electrode, a gate electrode, and at least one nanowire may be formed on the wafer by etching the doped wafer.

A wafer may be doped by implanting an impurity ion in the wafer.

A resonator manufactured by the method may have three terminals.

The substrate, the drain electrode, the source electrode, and the gate electrode may be formed on the wafer before the at least one nanowire is formed.

In another aspect, a resonator is provided. The resonator includes a substrate, a drain electrode formed on the substrate, a source electrode formed on the substrate, and at least one nanowire. A first end of the at least one nanowire is operatively connected to the drain electrode, a second end of the at least one nanowire is operatively connected to the source electrode, and the at least one nanowire is spaced apart from a top surface of the substrate.

At least one nanowire may be spaced apart from the top surface of the substrate by a predetermined distance.

The resonator may further include a first gate electrode formed on the substrate so as to be in a first side of the at least one nanowire.

The resonator may further include a second gate electrode formed on the substrate so as to be on a second side of the at least one nanowire.

The first gate electrode and the second gate electrode may be formed on the substrate so as to be on opposing sides of the at least one nanowire.

One of the drain electrode and the source electrode may be P-type doped, and the other electrode of the drain electrode and the source electrode may be N-type doped.

The first end of the at least one nanowire may be doped with the same impurities as those doped in the drain electrode, and the second end of the at least one nanowire may doped with the same impurities as those doped in the source electrode.

The resonator may be included in a device.

The resonator may be included in a transmission unit.

The resonator may be included in an oscillator circuit.

Other features and aspects will be apparent from the following detailed description, the drawings, and the claims.

BRIEF DESCRIPTION OF THE DRAWINGS

FIG. 2 is a diagram illustrating examples of resonators.

FIG. 3A is a diagram illustrating examples of resonators, each including three nanowires.

Figure 1A:
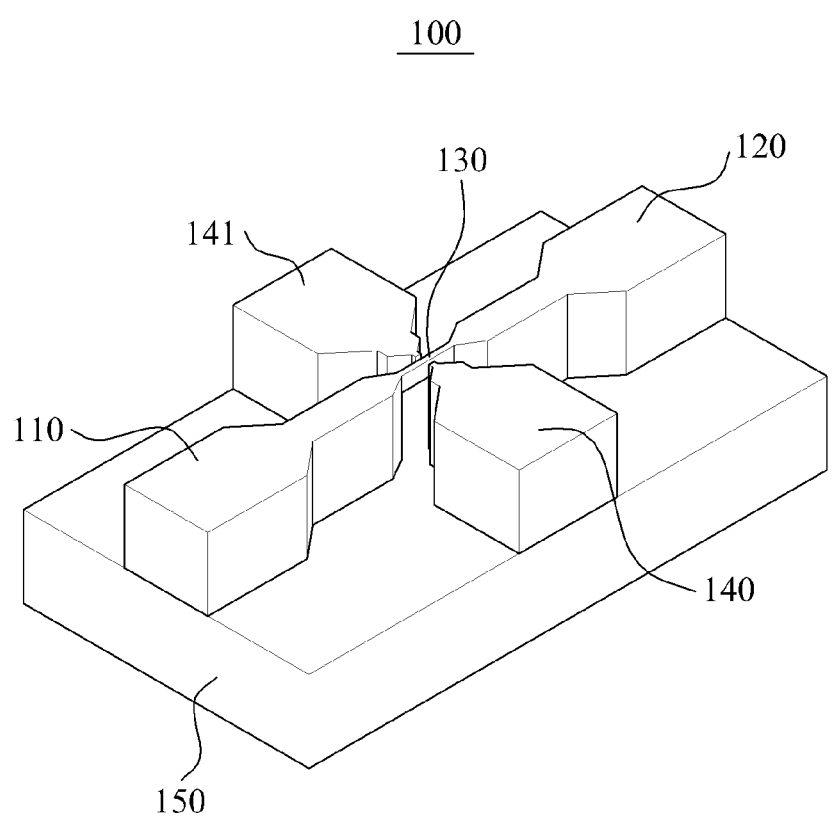
FIG. 1A is a diagram illustrating an example of a structure of a resonator.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness. FIG. 1A illustrates a structure of a resonator 100. Referring to FIG. 1A, the resonator 100 includes a substrate 150, a drain electrode 110, a source electrode 120, and a nanowire 130.

The substrate 150 may include, for example, a P-type silicon-on-insulator (SOI) substrate. Additionally, the substrate 150 may be low-doped.

The drain electrode 110 may be formed on the substrate 150. As an example, the drain electrode 110 may be either P-type doped or N-type doped. For example, to form the drain electrode 110, a wafer may be either P-type doped or N-type doped and the doped wafer may be etched.

The source electrode 120 may be formed on the substrate 150. As an example, the source electrode 120 may be doped with impurities different from those doped in the drain electrode 110. In an example in which the drain electrode 110 is P-type doped, the source electrode 120 may be N-type doped. In another example in which the drain electrode 110 is N-type doped, the source electrode 120 may be P-type doped. For example, to form the source electrode 120, a wafer may be either P-type doped or N-type doped and the doped wafer may be etched.

A first end of the nanowire 130 may be connected to the drain electrode 110, and a second end of the nanowire 130 may be connected to the source electrode 120. Additionally, as a non-limiting example, the nanowire 130 may be spaced apart by a predetermined distance from a top surface of the substrate 150.

As an example, the resonator 100 may include a plurality of nanowires. In other words, at least two nanowires may be connected between, for example, the drain electrode 110 and the source electrode 120. An example of a resonator including a plurality of nanowires is further described with reference to FIG. 3A.

As an example, the first end of the nanowire 130 may be P-type doped, and the second end of the nanowire 130 may be N-type doped. For example, the first end of the nanowire 130 may be doped with the same impurities as those doped in the drain electrode 110, and the second end of the nanowire 130 may be doped with the same impurities as those doped in the source electrode 120. In an example in which the drain electrode 110 is P-type doped, the first end of the nanowire 130 connected to the drain electrode 110 may also be P-type doped. In another example in which the source electrode 120 is N-type doped, the second end of the nanowire 130 connected to the source electrode 120 may also be N-type doped.

As a non-limiting example, the resonator 100 may further include a first gate electrode 140. The first gate electrode 140 may be formed on the substrate 150. As an example, the first gate electrode 140 may also be formed on a first side of the nanowire 130. A shape and a position of the first gate electrode 140 is further described with reference to FIGS. 2, 3A, 3B, and 3C.

As a non-limiting example, resonator 100 may further include a second gate electrode 141. As an example, the second gate electrode 141 may be formed on a second side of the nanowire 130. For example, the second gate electrode 141 may face the first gate electrode 140. The nanowire 130 may be connected between the first gate electrode 140 and the second gate electrode 141.

Figure 1B:
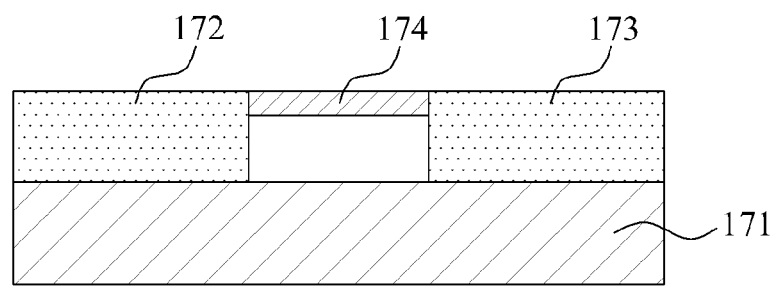
FIG. 1B is a diagram illustrating an example of a side of a resonator.

FIG. 1B illustrates an example of a side of a resonator 160.

Referring to FIG. 1B, a drain electrode 172 and a source electrode 173 may be formed on a substrate 171 of the resonator 160. Additionally, a first end and a second end of a nanowire 174 may be connected to the drain electrode 172 and the source electrode 173, respectively. Furthermore, as a non-limiting example, the nanowire 174 may be spaced apart by a predetermined distance from a top surface of the substrate 171.

FIG. 2 illustrates examples of resonators.

Referring to FIG. 2, resonators 210, 220, 230, 240, 250, and 260 respectively include: drain electrodes 211, 221, 231, 241, 251, and 261; source electrodes 212, 222, 232, 242, 252, and 262; gate electrodes 213, 223, 233, 243, 253, and 263; and nanowires 214, 224, 234, 244, 254, and 264. Drain electrodes 211, 221, 231, 241, 251, and 261 may be different in, for example, shape, size, position, and the like, or any combination thereof, from each other. Source electrodes 212, 222, 232, 242, 252, and 262 may be different in, for example, shape, size, position, and the like, or any combination thereof, from each other. Additionally, gate electrodes 213, 223, 233, 243, 253, and 263 may be different in, for example, shape, size, position, and the like, or any combination thereof, from each other. Nanowires 214, 224, 234, 244, 254, and 264 may be different in, for example, shape, size, position, and the like, or any combination thereof, from each other.

For example, a gap between the drain electrode 211 and the source electrode 212 in the resonator 210 may be narrower than a gap between the drain electrode 241 and the source electrode 242 in the resonator 240. Accordingly, as an example, the nanowire 214 connecting the drain electrode 211 and the source electrode 212 may be shorter than the nanowire 244 of the resonator 240.

FIG. 3A illustrates examples of resonators, each including three nanowires.

Referring to FIG. 3A, resonators 310, 320, 330, 340, 350, and 360, each including three nanowires, respectively include: drain electrodes 311, 321, 331, 341, 351, and 361; source electrodes 312, 322, 332, 342, 352, and 362; gate electrodes 313, 323, 333, 343, 353, and 363; and nanowire units 314, 324, 334, 344, 354, and 364. Drain electrodes 311, 321, 331, 341, 351, and 361 may be different in, for example, shape, size, position, and the like, or any combination thereof, from each other. Source electrodes 312, 322, 332, 342, 352, and 362 may be different in, for example, shape, size, position, and the like, or any combination thereof, from each other. Additionally, gate electrodes 313, 323, 333, 343, 353, and 363 may be different in, for example, shape, size, position, and the like, or any combination thereof, from each other. Nanowire units 314, 324, 334, 344, 354, and 364 may be different in, for example, shape, size, position, and the like, or any combination thereof, from each other.

For example, each of the nanowire units 314, 324, 334, 344, 354, and 364 may include at least three nanowires. Accordingly, in contrast to the nanowires 214, 224, 234, 244, 254, and 264 of the example illustrated in FIG. 2, at least three nanowires may be used to respectively connect each of the drain electrodes 311, 321, 331, 341, 351, and 361 to each of the source electrodes 312, 322, 332, 342, 352, and 362.

For example, the drain electrode 211, the source electrode 212, and the gate electrode 213 in the resonator 210 of the example illustrated in FIG. 2 may be identical in, for example, shape, size, position, and the like, or any combination thereof, to the drain electrode 311, the source electrode 312, and the gate electrode 313 in the resonator 310 of the example illustrated in FIG. 3. However, the nanowire 214 may be formed to connect the drain electrode 211 and the source electrode 212 in the resonator 210, and three nanowires of the nanowire unit 314 may be formed to connect the drain electrode 311 and the source electrode 312 in the resonator 310.

Figure 3B:
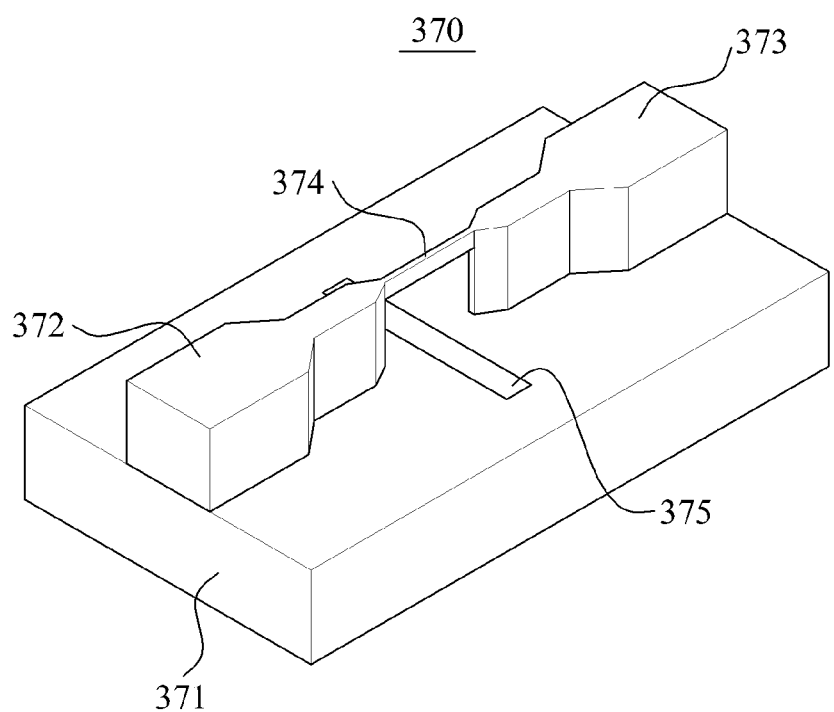
FIGS. 3B and 3C are diagrams illustrating examples of resonators, each including gate electrodes.
Figure 3C:
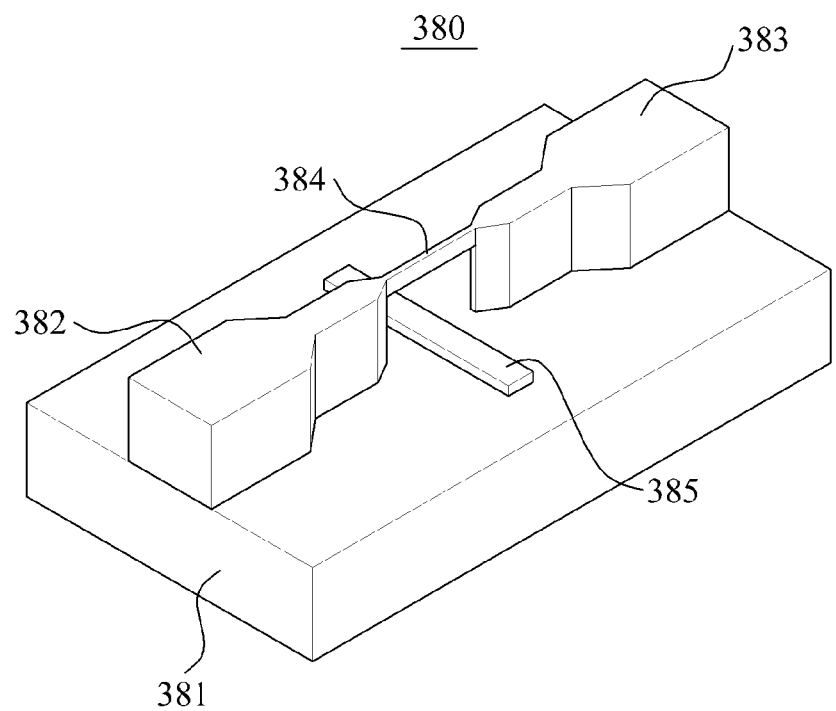

FIGS. 3B and 3C illustrate examples of resonators, each including gate electrodes.

Referring to FIG. 3B, a gate electrode 375 may be formed on a substrate 371 of a resonator 370, and may be located between a drain electrode 372 and a source electrode 373. The gate electrode 375 may be formed below a nanowire 374. For example, the drain electrode 372 and the source electrode 373 may also be formed on the substrate 371, and the nanowire 374 may be spaced apart by a predetermined distance from a top surface of the substrate 371. As a non-limiting example, the gate electrode 375 may be formed to be inserted into the substrate 371.

Referring to FIG. 3C, a gate electrode 385 may be formed on a substrate 381 of a resonator 380, and may be located between a drain electrode 382 and a source electrode 383. The gate electrode 385 may be formed below a nanowire 384. For example, the drain electrode 382 and the source electrode 383 may also be formed on the substrate 381, and the nanowire 384 may be spaced apart by a predetermined distance from a top surface of the substrate 381. As a non-limiting example, the gate electrode 385 may be formed to protrude a predetermined distance from the top surface of the substrate 381.

Shapes of the gate electrodes 375 and 385 of FIGS. 3B and 3C are non-limiting examples, and accordingly, the gate electrodes 375 and 385 may have other shapes.

Figure 4:
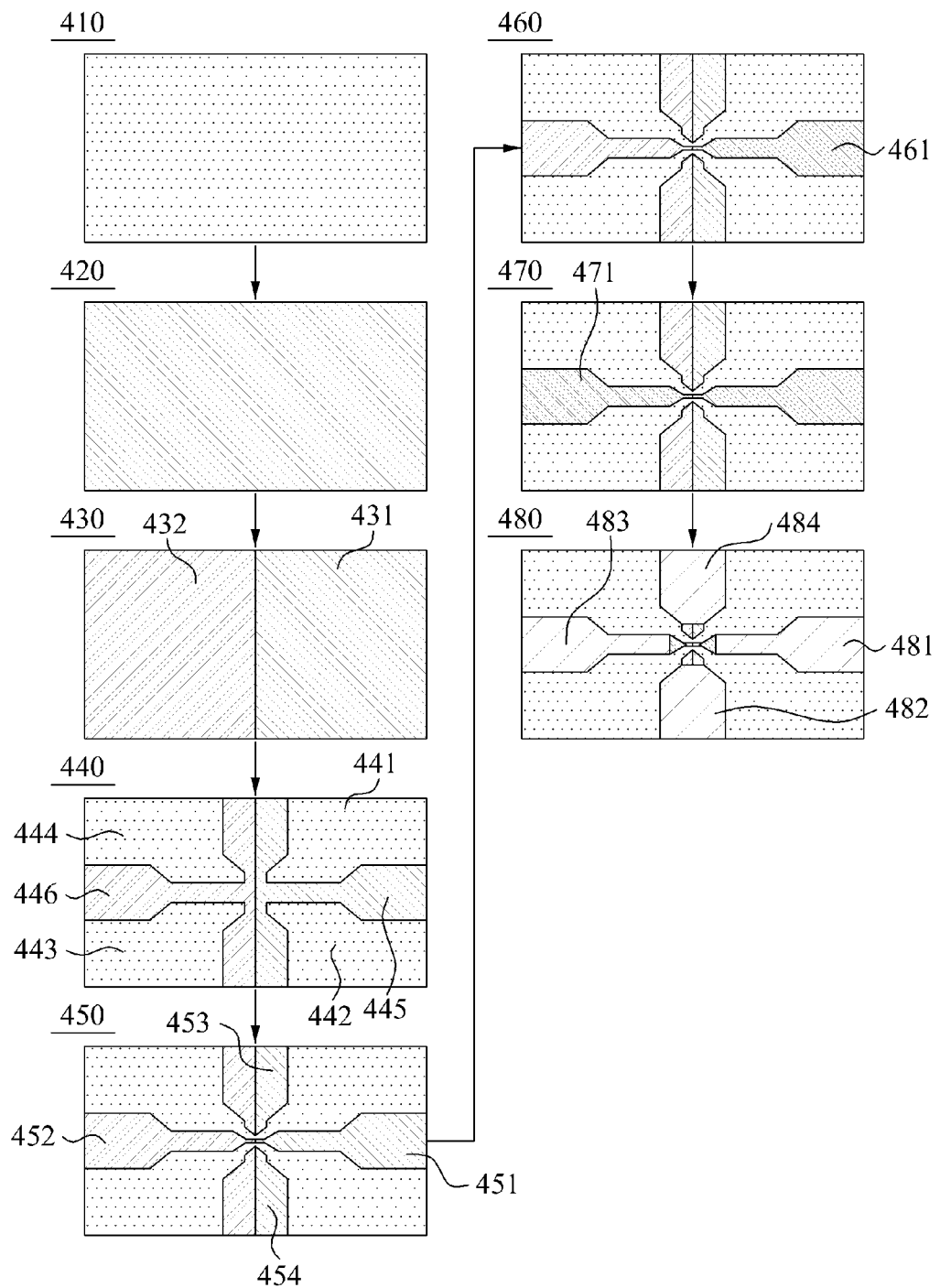
FIG. 4 is a diagram illustrating an example of a method of manufacturing a resonator.

FIG. 4 is a diagram illustrating an example of a method for manufacturing a resonator.

Referring to FIG. 4, an impurity ion may be implanted in a wafer 410, to dope the wafer 410.

The wafer 410 may include, for example, a P-type SOI wafer. Additionally, for example, the wafer 410 may be low-doped.

In the method illustrated in FIG. 4, a P-type impurity ion may be implanted in the wafer 410. A wafer 420 may indicate a state in which the P-type impurity ion may be implanted in the wafer 410. For example, a P-channel may be formed by implanting a Boron (B) ion in the wafer 410. The P-channel may have a dimension substantially equal to $2 \times 10^{-11}$ cm$^3$.

Thereafter, an N-type impurity ion may be further implanted in the wafer 420 in which the P-type impurity ion may be implanted. For example, a photolithography process may be performed on the wafer 420, and then the N-type impurity ion may be implanted in the wafer 420.

A wafer 430 may indicate a state in which the N-type impurity ion may be implanted in the wafer 420. For example, an N-channel may be formed by implanting an arsenic (As) ion in a second region 432 of the wafer 430. The N-channel may have a dimension substantially equal to or on the order of $1 \times 10^{-12}$ cm$^3$. Accordingly, a first region 431 of the wafer 430 may be P-type doped, and the second region 432 may be N-type doped.

A mesa pattern may be formed by etching the wafer 430, of which the first region 431 and second region 432 are P-type doped and N-type doped, respectively. A wafer 440 may indicate a state in which the mesa pattern may be formed by etching the wafer 430. For example, four etching regions 441, 442, 443, and 444 of the wafer 440 may be etched. Accordingly, a P-type doped pattern 445, and an N-type doped pattern 446 may be formed.

After the photolithography process is performed on the wafer 430, the wafer 430 may be etched to form the mesa pattern. For example, dry etching may be performed on the wafer 430, to form the mesa pattern.

Additionally, an active region may be formed by etching the wafer 440. A wafer 450 may indicate a state in which the active region may be formed by etching the wafer 440. For example, an electron beam lithography may be performed on the wafer 440, and thereafter the wafer 440 may be dry etched, to form the active region. For example, a first pattern 451 may be used as a drain electrode of a resonator, and a second pattern 452 may be used as a source electrode of the resonator. The first pattern 451 may be P-type doped, and the second pattern 452 may be N-type doped. Additionally, at least one nanowire may be formed between the first pattern 451 and the second pattern 452, to connect the first pattern 451 and the second pattern 452. Furthermore, a first end of the at least one nanowire connected to the first pattern 451 may be P-type doped, and a second end the at least one nanowire connected to the second pattern 452 may be N-type doped. Moreover, a third pattern 453 and a fourth pattern 454 may be used as gate electrodes of the resonator.

As an example, a P-type impurity ion may be implanted in the first pattern 451 of the wafer 450, and cobalt silicide may be formed. A wafer 460 may indicate a state in which the P-type impurity ion may be implanted in the first pattern 451 of the wafer 450. For example, cobalt silicide may be formed by implanting a Boron (B) ion in the first pattern 451 of the wafer 450. The cobalt silicide may have dimensions substantially equal to or on the order of $1 \times 10^{-14}$ cm$^3$.

Subsequently, an N-type impurity ion may be implanted in the second pattern 452 of the wafer 450, and cobalt silicide may be formed. A wafer 470 may indicate a state in which the N-type impurity ion may be implanted in the second pattern 452 of the wafer 450. For example, cobalt silicide may be formed by implanting an arsenic (As) ion in the second pattern 452 of the wafer 450. The cobalt silicide may have dimensions substantially equal to or on the order of $1 \times 10^{-14}$ cm$^3$.

Additionally, for example, a thermal annealing process may be performed on the wafer 470. For example, the thermal annealing process may be performed on the wafer 470 at 1000° C. for 30 seconds.

Furthermore, a metal deposition process may be performed on the wafer 470 to metalize the wafer 470. A wafer 480 may indicate a state in which the metal deposition process may be performed on the wafer 470. For example, after the photolithograph process, the metal deposition process may be performed on the wafer 470. For example, titanium (Ti, 10 nm), or gold (Au, 100 nm) may be deposited on the wafer 470. Additionally, for example, after the metal deposition process, metal etching may be performed to generate the wafer 480.

As an example, a first pattern 481 and a second pattern 483 of the wafer 480 may be used as a drain electrode and a source electrode of a resonator, respectively. Additionally, at least one nanowire may be formed between the first pattern 481 and the second pattern 483. Furthermore, a third pattern 482 and a fourth pattern 484 of the wafer 480 may be used as gate electrodes of the resonator.

Figure 5:
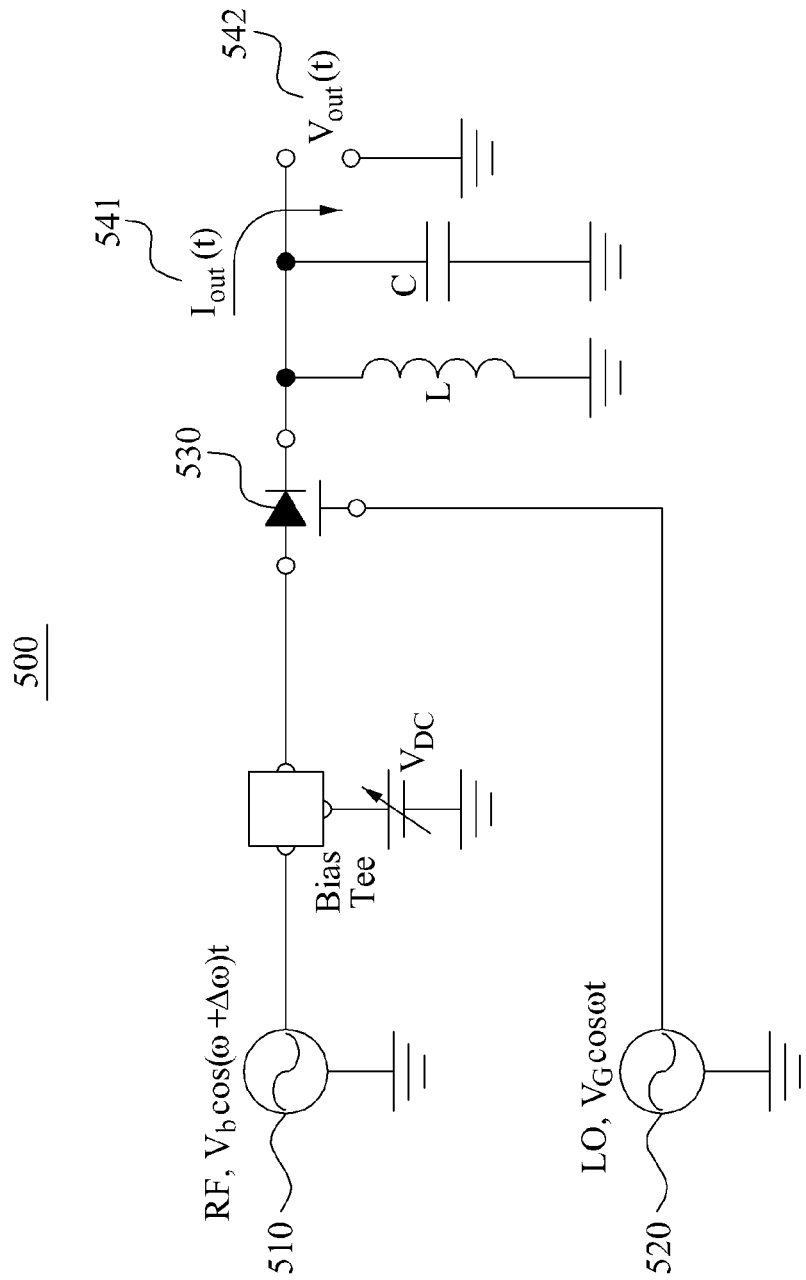
FIG. 5 is a diagram illustrating an example of a single nanowire PN diode mixer in which a resonator having a single nanowire is used.

FIG. 5 illustrates an example of a single nanowire PN diode mixer 500 in which a resonator having a single nanowire is used.

Referring to FIG. 5, in the single nanowire PN diode mixer 500, a radio frequency (RF) input 510 may be input to the single nanowire PN diode mixer 500, and a local oscillator (LO) input 520 may be applied to a gate of a diode 530. For example, an output voltage $V_{out}(t)$ 542 and an output current $I_{out}(t)$ 541 with respect to the RF input 510 and the LO input 520 may be expressed as provided in Equation 1.

$$I_{out}(t) = I_o(t) e^{\frac{q}{kT}(V_{DC} + V_\Delta \cos(\omega + \Delta\omega)t - V_{out}(t))} \quad \text{[Equation 1]}$$

$$I_{out}(t) = I_{DC} + I_1 \cos(\omega + \Delta\omega)t +$$
$$I_2 \cos\omega t + I_3 \cos\Delta\omega t + I_4 \cos(2\omega + \Delta\omega)t$$

$$V_{out}(t) = V_1 \cos(\omega + \Delta\omega)t + V_2 \cos\omega t +$$
$$V_3 \cos\Delta\omega t + V_4 \cos(2\omega + \Delta\omega)t$$

$$I_o(t) = I_o + \Delta I \cos\omega t$$

In Equation 1, q/kT denotes a thermal voltage, and ΔI denotes a change in a saturation current based on modification of a gate oscillator.

Equation 1 may be summarized as provided in Equation 2.

$$I_{DC} + I_1 \cos(\omega + \Delta\omega)t + I_2 \cos\omega t + I_3 \cos\Delta\omega t + \quad \text{[Equation 2]}$$
$$I_4 \cos(2\omega + \Delta\omega)t = (I_o + \Delta I \cos\omega t) e^{\frac{qV_{DC}}{kT}} \times$$
$$e^{\frac{q}{kT}(V_\Delta \cos(\omega+\Delta\omega)t - V_1 \cos(\omega+\Delta\omega)t - V_2 \cos\omega t - V_3 \cos\Delta\omega t - V_4 \cos(2\omega+\Delta\omega)t)}$$

For example, as an exponential function of Equation 2 may be expanded to a series, and as coefficients of a frequency term Δω are compared, Equation 3 may be derived as follows:

$$I_3 = \frac{1}{2}\Delta I e^{\frac{qV_{DC}}{kT}} \frac{qV_b}{kT} - \frac{1}{2}\Delta I e^{\frac{qV_{DC}}{kT}} \frac{qV_1}{kT} - I_o e^{\frac{qV_{DC}}{kT}} \frac{qV_3}{kT} \quad \text{[Equation 3]}$$

For example, because flow of an intermediate frequency (IF) current may be blocked due to a bias circuit of an output end and a bypass capacitor, "$I_3 \sim 0$" and "$V_b \gg V_1$" may be realized. Accordingly, Equation 4 may be derived from Equation 3.

$$V_3 = \frac{\Delta I}{2 I_o} V_b \quad \text{[Equation 4]}$$

A conventional nanowire resistor mixer may have "$(\Delta R/2R_o)V_b$" as a value of $V_3$. Accordingly, comparing $V_3$ of the conventional nanowire resistor mixer with $V_3$ in Equation 4 of the single nanowire PN diode mixer 500, "$(\Delta I/2I_o) \gg (\Delta R/R_o)$" may be realized. Thus, the single nanowire PN diode mixer 500 may have an output signal amplitude higher than the conventional nanowire resistor mixer.

Figure 6:
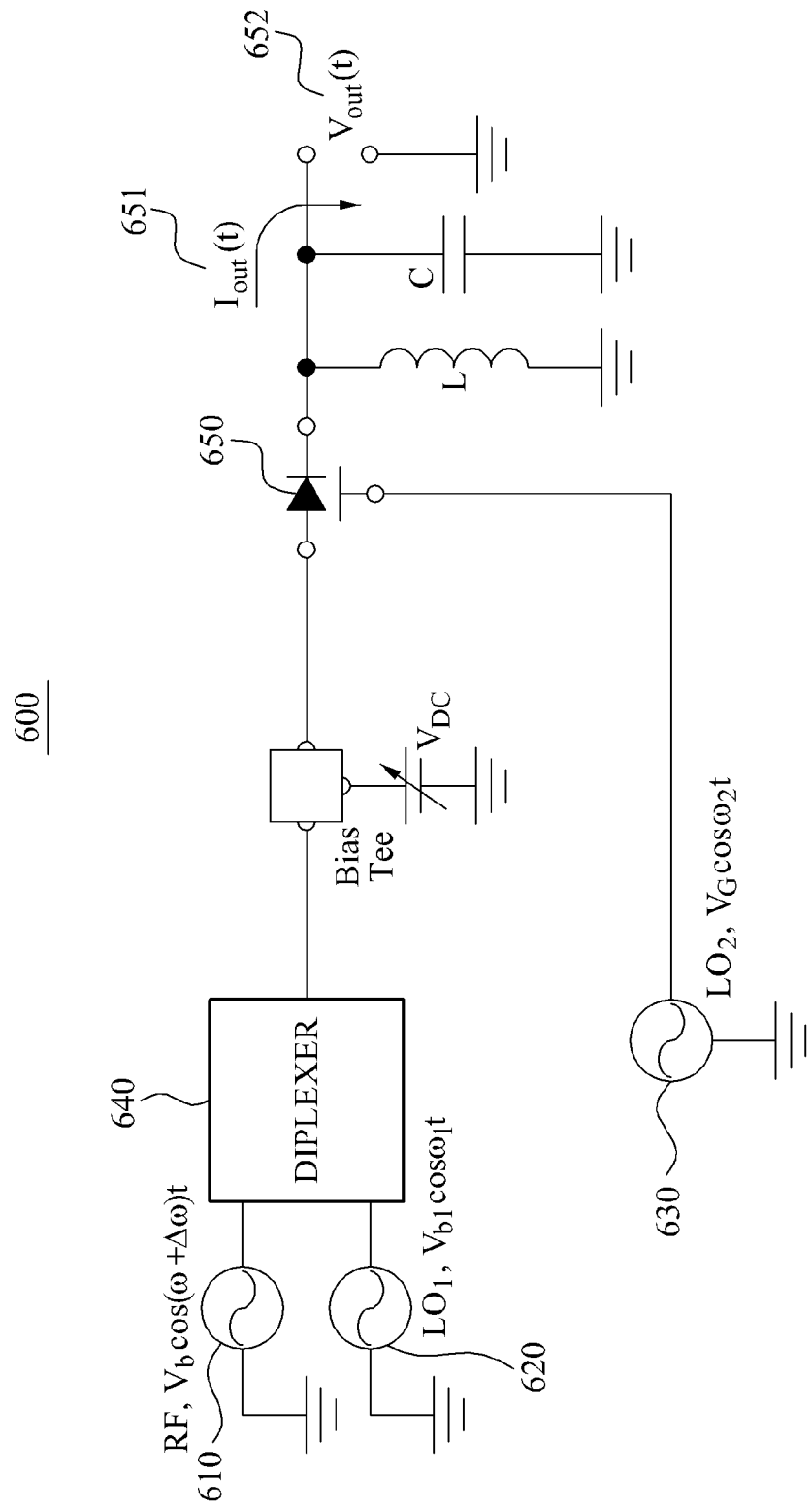
FIG. 6 is a diagram illustrating an example of a single nanowire PN diode mixer in which a diplexer is used.

FIG. 6 illustrates an example of a single nanowire PN diode mixer 600 in which a diplexer 640 is used.

Referring to FIG. 6, in the single nanowire PN diode mixer 600, an RF input 610 and a LO input 620 may be input to the diplexer 640, and may be used as input signals of a diode 650. In other words, the RF input 610 and the LO input 620 may be input to the diplexer 640, and may be output from the diplexer 640 to the diode 650.

For example, an output current $I_{out}(t)$ 651, and an output voltage $V_{out}(t)$ 652 of the diode 650 may be expressed as provided in Equation 5.

$$I_{out}(t) = (I_o + \Delta I \cos\omega_2 t) e^{\frac{q}{kT}(V_{DC} + V_\Delta \cos\omega t + V_{\Delta 1} \cos\omega_1 t - V_{out}(t))} \quad \text{[Equation 5]}$$

$$I_{out}(t) = I_{DC} + I_1 \cos\omega_1 t + I_2 \cos\omega_2 t + I_3 \cos\omega t +$$
$$I_4 \cos(\omega_1 - \omega_2)t + I_5 \cos(\omega_1 - \omega)t + I_6 \cos(\omega_2 - \omega)t$$

$$V_{out}(t) = V_1 \cos\omega_1 t + V_2 \cos\omega_2 t + V_3 \cos\omega t +$$
$$V_4 \cos(\omega_1 - \omega_2)t + V_5 \cos(\omega_1 - \omega)t + V_6 \cos(\omega_2 - \omega)t$$

In Equation 5, q/kT denotes a thermal voltage, and ΔI denotes a change in a saturation current based on modification of a gate oscillator.

In the same manner as in Equations 2 and 3, Equation 6 may be derived below, by expanding an exponential function of Equation 5 to a series, by comparing coefficients of a frequency term Δω, and by using "$I_3 \sim 0$" and "$V_b \gg V_1$." For example, because flow of an IF current may be blocked due to a bias circuit of an output end and a bypass capacitor, "$I_3 \sim 0$" and "$V_b \gg V_1$" may be realized.

$$V_4 = \frac{\Delta I}{2I_o} V_{b1}(\omega_1 - \omega_2 \text{ component}) \quad \text{[Equation 6]}$$

$$V_5 = \frac{qV_b}{2kT} V_{b1}(\omega_1 - \omega_2 \text{ component})$$

$$V_6 = \frac{\Delta I}{2I_o} V_b(\omega - \omega_2 \text{ component})$$

In other words, as illustrated in Equation 6, mixing of IF frequencies "ω1−ω," "ω2−ω," and "ω1−ω2" may be derived.

The resonators described in the examples herein may be included in an electronic apparatus. For example, the resonator may be or may be included in a terminal such as a mobile terminal, a smart phone, a computer, a tablet, a camera, a home appliance, a sensor, and the like. As a non-exhaustive illustration only, a terminal described herein may refer to a computer or computing system, mobile devices such as a cellular phone, a personal digital assistant (PDA), a digital camera, a portable game console, and an MP3 player, a portable/personal multimedia player (PMP), a handheld e-book, a portable lab-top PC, a global positioning system (GPS) navigation, and devices such as a desktop PC, a high definition television (HDTV), an optical disc player, a setup box, and the like capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for manufacturing a resonator, the method comprising:
   doping a wafer;
   forming on the wafer a substrate, a drain electrode, a source electrode, a gate electrode, and at least one nanowire; and
   forming a first portion of the at least one nanowire to be of one dope type region and a second portion of the at least one nanowire to be another dope type region,
   wherein the second portion comprises a remaining part of the at least one nanowire exclusive of the first portion,
   wherein the first portion and the second portion are placed between the drain electrode and the source electrode, and
   wherein each of the first portion and the second portion comprises half of the at least one nanowire.

2. The method of claim 1, wherein a first end of the at least one nanowire is operatively connected to the drain electrode, a second end of the at least one nanowire is operatively connected to the source electrode, and the at least one nanowire is spaced apart from a top surface of the substrate.

3. The method of claim 2, wherein the at least one nanowire is spaced apart by a predetermined distance from a top surface of the substrate.

4. The method of claim 2, wherein the first end of the at least one nanowire is P-type doped, and the second end of the at least one nanowire is N-type doped.

5. The method of claim 1, wherein the doping comprises P-type doping a first region of the wafer and N-type doping a second region of the wafer,
   wherein the second region comprises remaining part of the wafer exclusive of the first region.

6. The method of claim 5, wherein the P-type doping and the N-type doping comprises:
   P-type doping the first region by implanting a P-type impurity ion in the first region; and
   N-type doping the second region, by implanting an N-type impurity ion in the second region.

7. The method of claim 5, wherein the drain electrode is formed by etching one of the P-type doped first region and the N-type doped second region, and
   wherein the source electrode is formed by etching the other one of the P-type doped first region and the N-type doped second region.

8. The method of claim 1, wherein the gate electrode is formed on a side of the at least one nanowire.

9. The method of claim 1, further comprising forming a second gate electrode on the wafer.

10. The method of claim 9, wherein the gate electrode and the second gate electrode are formed on the wafer so as to be on opposing sides of the at least one nanowire.

11. The method of claim 10, wherein the first gate electrode and second gate electrode are formed on the wafer so as to be spaced apart at a predetermined distance from the at least one nanowire.

12. The method of claim 1, wherein the substrate, the drain electrode, the source electrode, the gate electrode, and the at least one nanowire are formed on the wafer by etching the doped wafer.

13. The method of claim 1, wherein the wafer is doped by implanting an impurity ion in the wafer.

14. A resonator manufactured by the method of claim 1, wherein the resonator has three terminals.

15. The method of claim 1, wherein the substrate, the drain electrode, the source electrode, and the gate electrode are formed on the wafer before the at least one nanowire is formed.

16. The method of claim 1, further comprising forming more than one nanowire.

17. The method of claim 1, wherein a P-channel is formed to have a dimension of about $2 \times 10\text{-}11$ cm3.

18. The method of claim 1, wherein an N-channel is formed to have a dimension of about $1 \times 10\text{-}12$ cm3.

19. The method of claim 1, further comprising forming the gate electrode below the nanowire.

20. The method of claim 1, wherein the state in which the active region is formed comprises at least the drain electrode, the source electrode, and the gate electrode.

21. The method of claim 1, wherein the etching comprises etching the wafer to form a first shape identifying the drain electrode, a second shape identifying the source electrode, and a third shape identifying the gate electrode.

* * * * *